United States Patent
Olsen et al.

(10) Patent No.: US 8,198,671 B2
(45) Date of Patent: Jun. 12, 2012

(54) MODIFICATION OF CHARGE TRAP SILICON NITRIDE WITH OXYGEN PLASMA

(75) Inventors: Christopher Sean Olsen, Fremont, CA (US); Tze Wing Poon, Sunnyvale, CA (US); Udayan Ganguly, Sunnyvale, CA (US); Johanes Swenberg, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/799,365

(22) Filed: Apr. 22, 2010

(65) Prior Publication Data
US 2010/0270609 A1    Oct. 28, 2010

Related U.S. Application Data

(60) Provisional application No. 61/171,823, filed on Apr. 22, 2009.

(51) Int. Cl.
*H01L 29/792* (2006.01)
*H01L 21/336* (2006.01)

(52) U.S. Cl. ......... 257/324; 257/E29.309; 257/E21.423; 438/287; 438/954

(58) Field of Classification Search .................. None
See application file for complete search history.

(56) References Cited

U.S. PATENT DOCUMENTS

| | | | |
|---|---|---|---|
| 5,440,507 A | 8/1995 | Brady et al. | |
| 5,989,623 A | 11/1999 | Chen et al. | |
| 6,037,235 A | 3/2000 | Narwankar et al. | |
| 6,207,222 B1 | 3/2001 | Chen et al. | |
| 6,413,871 B2 | 7/2002 | M'Saad et al. | |
| 6,537,905 B1 | 3/2003 | Chen et al. | |
| 6,768,157 B2 | 7/2004 | Krieger et al. | |
| 6,806,203 B2 | 10/2004 | Weidman et al. | |
| 6,833,582 B2 | 12/2004 | Mine et al. | |
| 6,878,620 B2 | 4/2005 | Nguyen et al. | |
| 6,888,200 B2 | 5/2005 | Bhattacharyya | |
| 6,893,907 B2 | 5/2005 | Maydan et al. | |
| 6,925,007 B2 | 8/2005 | Harari | |
| 7,064,078 B2 | 6/2006 | Liu et al. | |
| 7,079,740 B2 | 7/2006 | Vandroux et al. | |

(Continued)

FOREIGN PATENT DOCUMENTS

JP    60117435    6/1985

(Continued)

OTHER PUBLICATIONS

Kapoor et al., "MNOS Memory Technology with Oxynitride Thin Films"; IEEE Transactions on Components, Packaging, and Manufacturing Technology; Part A, vol. 17, No. 3, (1994).

*Primary Examiner* — Hoang-Quan Ho
(74) *Attorney, Agent, or Firm* — Ashok K. Janah; Janah & Associates, P.C.

(57) ABSTRACT

A flash memory device comprises a substrate comprising silicon with a silicon dioxide layer thereon. A silicon-oxygen-nitrogen layer is on the silicon dioxide layer, and the silicon-oxygen-nitrogen layer comprises a shaped concentration level profile of oxygen through the thickness of the layer. A blocking dielectric layer is on the silicon-oxygen-nitrogen layer, and a gate electrode is on the blocking dielectric layer. Oxygen ions can be implanted into a silicon nitride layer to form the silicon-oxygen-nitrogen layer.

30 Claims, 3 Drawing Sheets

U.S. PATENT DOCUMENTS

| | | | |
|---|---|---|---|
| 7,112,528 B2 | 9/2006 | Chen et al. |
| 7,163,877 B2 | 1/2007 | Niimi |
| 7,183,166 B2 | 2/2007 | Wang |
| 7,220,982 B2 | 5/2007 | Campbell |
| 7,229,911 B2 | 6/2007 | Rajagopalan et al. |
| 7,253,046 B2 | 8/2007 | Higashi et al. |
| 7,253,123 B2 | 8/2007 | Arghavani et al. |
| 7,279,740 B2 | 10/2007 | Bhattacharyya et al. |
| 7,294,581 B2 | 11/2007 | Iyer et al. |
| 7,341,918 B2 | 3/2008 | Harari |
| 7,342,279 B2 | 3/2008 | Harari |
| 7,407,893 B2 | 8/2008 | Seamons et al. |
| 7,416,995 B2 | 8/2008 | Iyer et al. |
| 7,601,589 B2 | 10/2009 | Kim |
| 7,619,247 B2 | 11/2009 | Moore et al. |
| 7,638,440 B2 | 12/2009 | Wang et al. |
| 7,659,205 B2 | 2/2010 | Campbell |
| 2003/0155602 A1 | 8/2003 | Krieger et al. |
| 2003/0176058 A1 | 9/2003 | Weidman et al. |
| 2003/0178667 A1 | 9/2003 | Krieger et al. |
| 2004/0009642 A1 | 1/2004 | Yoo et al. |
| 2004/0026729 A9 | 2/2004 | Krieger et al. |
| 2004/0092095 A1 | 5/2004 | Nguyen et al. |
| 2004/0235292 A1 | 11/2004 | Rajagopalan et al. |
| 2005/0199013 A1 | 9/2005 | Vandroux et al. |
| 2005/0199585 A1 | 9/2005 | Wang et al. |
| 2005/0202683 A1 | 9/2005 | Wang et al. |
| 2005/0224866 A1 | 10/2005 | Higashi et al. |
| 2005/0236664 A1 | 10/2005 | Aoki et al. |
| 2005/0287771 A1 | 12/2005 | Seamons et al. |
| 2006/0046479 A1 | 3/2006 | Rajagopalan et al. |
| 2006/0094257 A1 * | 5/2006 | Hoffman et al. ............. 438/778 |
| 2006/0131555 A1 | 6/2006 | Liu et al. |
| 2006/0131556 A1 | 6/2006 | Liu et al. |
| 2006/0231823 A1 | 10/2006 | Moore et al. |
| 2006/0244086 A1 | 11/2006 | Yin et al. |
| 2007/0087575 A1 | 4/2007 | Iyer et al. |
| 2007/0111546 A1 | 5/2007 | Iyer et al. |
| 2007/0132054 A1 | 6/2007 | Arghavani et al. |
| 2007/0184605 A1 | 8/2007 | Lee |
| 2007/0238254 A1 | 10/2007 | Ordonio |
| 2008/0020591 A1 | 1/2008 | Balseanu et al. |
| 2008/0093589 A1 | 4/2008 | Liu et al. |
| 2008/0099832 A1 | 5/2008 | Eitan |
| 2008/0179655 A1 | 7/2008 | Ishida et al. |
| 2008/0277641 A1 | 11/2008 | Stanton |
| 2009/0057752 A1 | 3/2009 | Wang et al. |
| 2009/0087977 A1 | 4/2009 | Spuller et al. |
| 2009/0104782 A1 | 4/2009 | Lu et al. |
| 2009/0256132 A1 | 10/2009 | Scheuerlein et al. |
| 2009/0258489 A1 | 10/2009 | Chen et al. |
| 2009/0261400 A1 * | 10/2009 | Ozawa et al. ................. 257/321 |
| 2009/0294828 A1 | 12/2009 | Ozawa et al. |
| 2010/0059808 A1 | 3/2010 | Zheng et al. |
| 2010/0140683 A1 * | 6/2010 | Miyazaki et al. ............ 257/324 |
| 2010/0283097 A1 * | 11/2010 | Endoh et al. .................. 257/324 |

FOREIGN PATENT DOCUMENTS

| | | |
|---|---|---|
| JP | 60161674 | 8/1985 |
| JP | 02266570 | 10/1990 |
| JP | 09045901 | 2/1997 |
| JP | 2005333112 | 12/2005 |
| TW | 0584943 | 4/2004 |
| TW | 0242845 | 11/2005 |
| TW | 0278039 | 4/2007 |
| WO | WO-9304506 | 3/1993 |
| WO | WO-9424707 | 10/1994 |
| WO | WO-9705665 | 2/1997 |
| WO | WO-9707550 | 2/1997 |
| WO | WO-9909593 | 2/1999 |
| WO | WO-2005076337 | 8/2005 |
| WO | WO-2005087974 | 9/2005 |
| WO | WO-2005091349 | 9/2005 |
| WO | WO-2005109473 | 11/2005 |
| WO | WO-2007047019 | 4/2007 |
| WO | WO-2007058720 | 5/2007 |
| WO | WO-2007149788 | 12/2007 |
| WO | WO2008123289 A1 * | 10/2008 |
| WO | WO2008/156215 A1 * | 12/2008 |

* cited by examiner

MODIFICATION OF CHARGE TRAP SILICON NITRIDE WITH OXYGEN PLASMA

CROSS-REFERENCE

Under 35 U.S.C. §119(e), the present application claims the benefit of the filing date of Provisional Application No. 61/171,823, filed on Apr. 22, 2009, entitled "MODIFICATION OF CHARGE TRAP SILICON NITRIDE WITH OXYGEN PLASMA," which is incorporated herein by reference in its entirety.

BACKGROUND

Embodiments of the present invention relate to non-volatile memory devices and their methods of manufacture.

Non-volatile memory devices, such as flash memories, are capable of retaining or storing charge without external power. A flash memory comprises an array of memory cells, each of which is configured to store a bit of information corresponding to a charge or gate threshold voltage. Newer flash memory devices can even store several bits of information per cell using parameters that exhibit more than two distinct levels.

Flash memory devices are of different types depending on their structure for storing charge. One type, commonly known as a floating gate memory, stores charge in a floating gate electrode disposed under a control gate electrode. However, in these devices, the conductive floating gate electrodes are electrically isolated for data retention, and the resultant gate structures have high aspect ratios that are hard to fabricate. Also, at higher aerial or device densities, the spacing between adjacent floating gate cells becomes very small. The smaller spacing can result in electrical coupling between adjacent cells and cause dissipation of the charge retained in these cells.

Another type, commonly known as the charge trap type flash memory, uses a gate insulating layer formed of silicon nitride to provide charge trap sites. Charge trap memories are advantageous as they can be manufactured with fewer process steps. However, as these devices become smaller, the net area of the trapping site or individual charge trap cell is reduced. The smaller area of the charge trap cell allows a smaller number of electrons to be loaded onto the charge trap cell. The decrease in electron holding capacity of each charge trap cell decreases the amount of information that may be stored in the cell.

For reasons that include these and other deficiencies, and despite the development of various flash memory devices, further improvements in memory devices and charge trap cells are continuously being sought.

SUMMARY

A flash memory device comprises a substrate comprising a semiconductor material. A tunneling oxide layer is on the semiconductor material. A silicon-oxygen-nitrogen layer is on the tunneling oxide layer. The silicon-oxygen-nitrogen layer comprises an oxygen concentration level profile having a predetermined shape. A blocking dielectric layer is on the silicon-oxygen-nitrogen layer, and a gate electrode is on the blocking dielectric layer.

In a method of forming a flash memory device, a substrate comprising a semiconductor material is provided, and a tunneling oxide layer is formed on the semiconductor material. A silicon-oxygen-nitrogen layer comprising an oxygen concentration level profile having a predetermined shape is formed on the tunneling oxide layer. A blocking dielectric layer is deposited on the silicon-oxygen-nitrogen layer, and a gate electrode is deposited on the blocking dielectric layer.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

Figure 3:
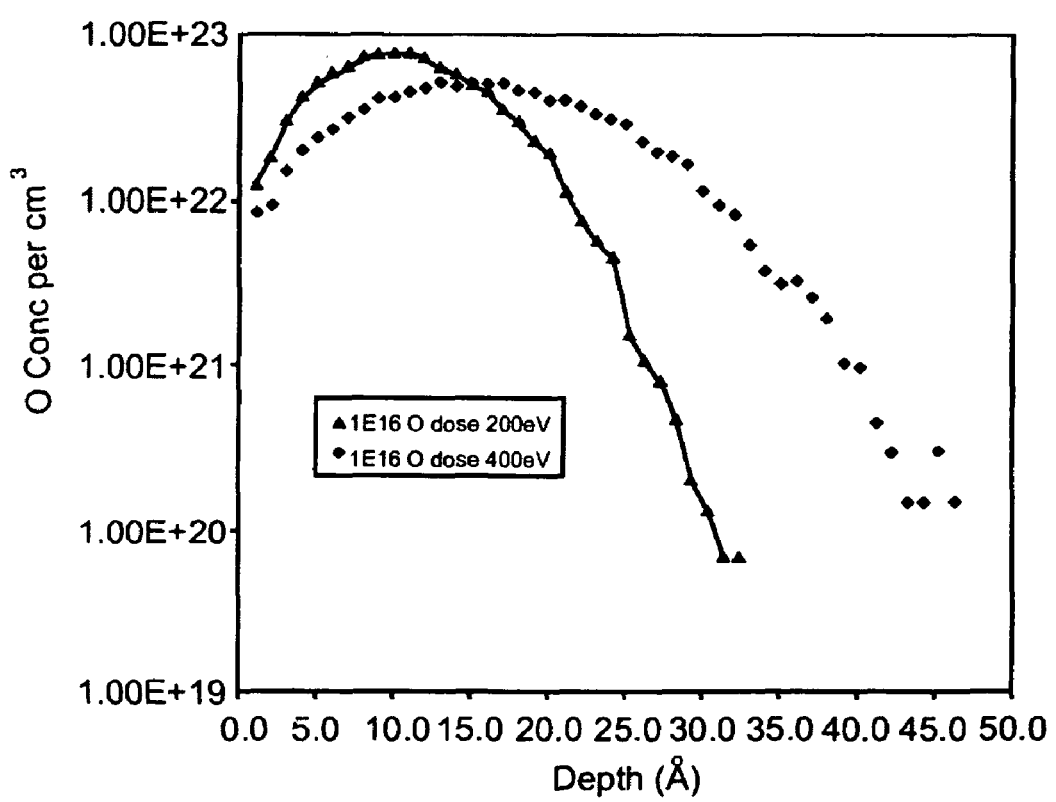
Figure 2A:
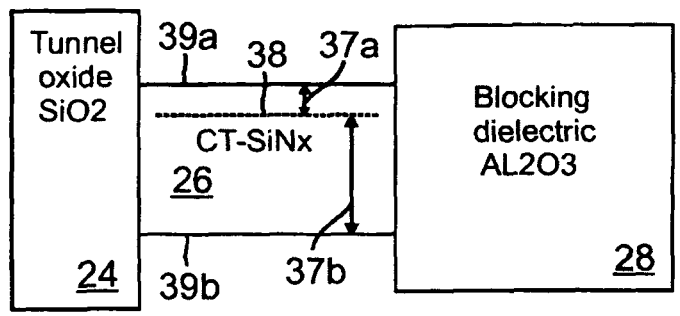
FIG. 2A is a schematic diagram of the potential band structure of a charge trap film comprising a silicon nitride layer.
Figure 2B:
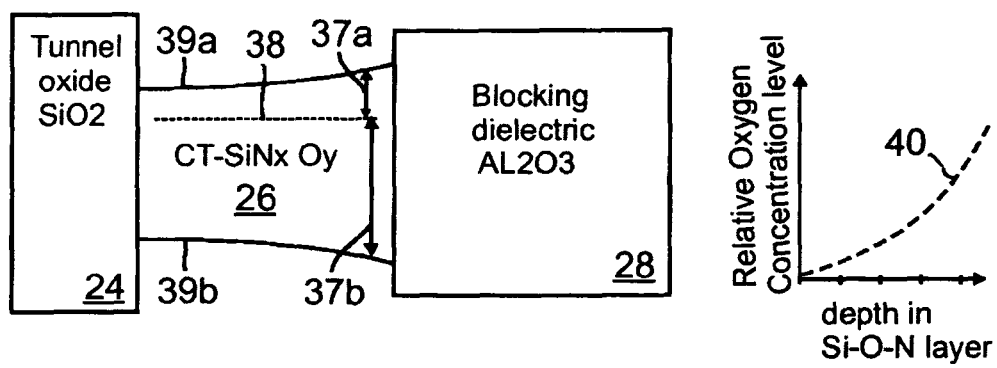
Figure 2C:
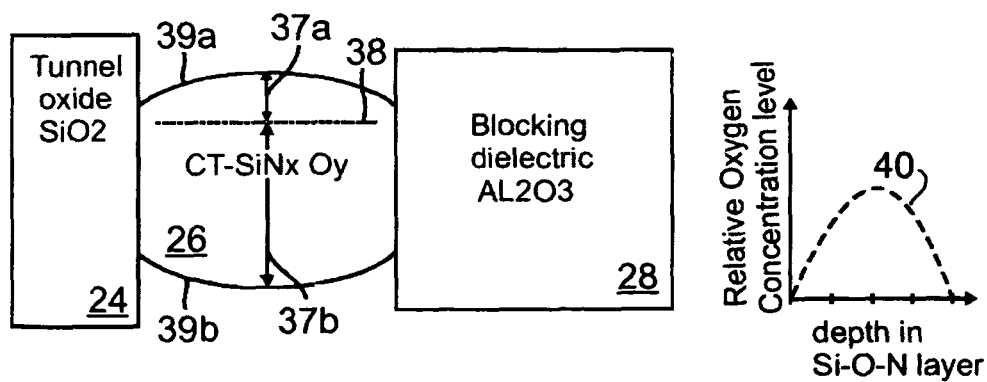
Figure 4:
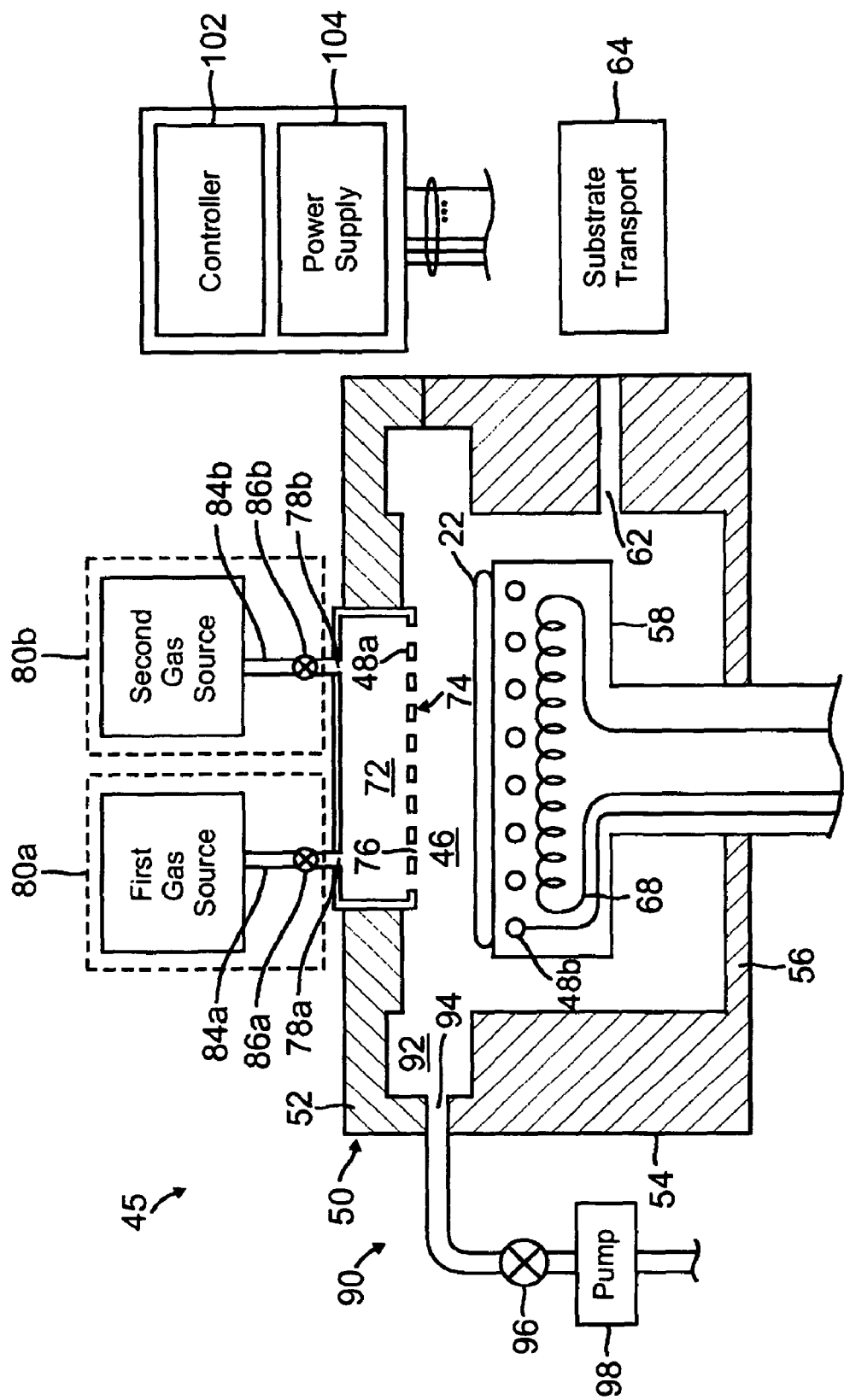

FIG. 2B is a schematic diagram of the potential band structure of a charge trap film comprising a silicon-oxygen-nitrogen layer having a shaped oxygen ion concentration profile showing the increased charge trap depth adjacent to the blocking dielectric layer, and a corresponding graph showing the upwardly increasing curved shape of the relative oxygen concentration level in the silicon-oxygen-nitrogen layer for increasing depth in the Si-O-N layer;

FIG. 2C is a schematic diagram of the potential band structure of a charge trap film comprising a silicon-oxygen-nitrogen layer having an oxygen ion concentration level profile which is shaped to provide an increased charge trap depth at a central position of the charge trap layer, and a corresponding graph showing the U-shaped curved shape of the relative oxygen concentration level in the silicon-oxygen-nitrogen layer as a function of increasing depth in the Si-O-N layer;

FIG. 3 is a computer modeled simulation of the oxygen ion concentration obtained at different depths of a silicon nitride layer for oxygen ions implanted with implantation ion energies of 200 eV and 400 eV;

FIG. 4 is a schematic sectional side view of an embodiment of a substrate processing chamber comprising a PECVD deposition chamber;

DESCRIPTION

Figure 1:
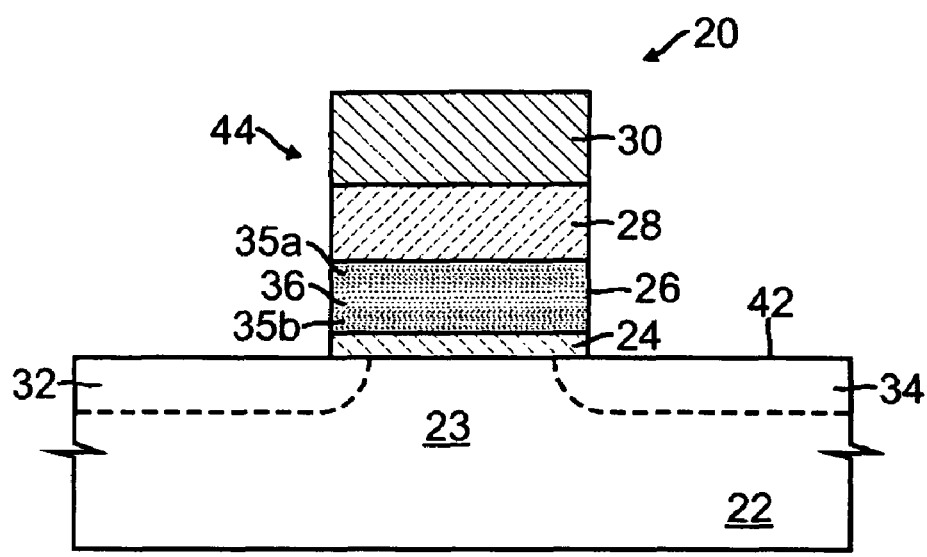
FIG. 1 is a schematic cross-sectional view of a flash memory device having a charge trap layer comprising a silicon-oxygen-nitrogen layer with a shaped oxygen concentration level profile.

An exemplary embodiment of a flash memory device 20 formed on a substrate 22 is illustrated in FIG. 1. The substrate 22 comprises a semiconductor material 23, such as silicon, polycrystalline silicon, germanium, silicon germanium, or a compound semiconductor. A silicon wafer can have single or large crystals of silicon. An exemplary compound semiconductor comprises gallium arsenide. The substrate 22 can be made from the semiconductor material 23 (as shown) or can have a layer of semiconductor material thereon (not shown). For example, a substrate 22 comprising a dielectric material, such as a panel or display, can have a layer of semiconductor material deposited thereon to serve as the active semiconducting layer of the substrate 22. Suitable dielectric materials include borophosphosilicate glass, phosphosilicate glass, borosilicate glass and phosphosilicate glass.

A tunneling oxide layer 24 is formed on the semiconductor material 23 of the substrate 22 to serve as an electron tunneling film. The tunneling oxide layer 24 comprises an electron tunneling material which allows electrons to tunnel through the layer 24. An exemplary tunneling oxide layer 24 comprises a layer of silicon dioxide in a thickness of from about 1 to 10 nm, or even from about 3 to about 7 nm.

A silicon-oxygen-nitrogen layer 26 comprising silicon, oxygen and nitrogen elements, is formed on the tunneling oxide layer 24. The silicon-oxygen-nitrogen layer 26 serves as the charge trapping or storing layer of the flash memory device 20. Electron trapping sites in the layer 26 retain and store charge passing through the tunneling oxide layer 24, with the threshold voltage of the layer 26 depending on whether or not electrons are already trapped in the charge trap layer. The silicon-oxygen-nitrogen layer 26 has an oxygen concentration level profile having a predetermined shape that retains charge without sacrificing device speed as described below.

A blocking dielectric layer 28 is deposited on the silicon-oxygen-nitrogen layer 26. The blocking dielectric layer 28 serves as a charge blocking layer which reduces leakage of the electrons trapped in the underlying charge trapping layer to the overlying gate electrode 30. The blocking dielectric layer 28 can also prevent or resist passage of charge from the other direction, namely from the gate electrode 30 into the charge trapping layer. The blocking dielectric layer 28 can be a high-k dielectric having a dielectric constant (k) value of from about 9 to about 11. Suitable dielectric materials include, for example, $Al_2O_3$, $SiO_2$, $HfO_2$, $ZrO_2$, LaO, LaAlO, LaHfO, HfAlO, HfAlON, $HfSiO_x$, HfSiON, and combinations thereof. In one version, the blocking dielectric layer 28 comprises aluminum oxide. This aluminum oxide layer can have a thickness of from about 10 nm to about 250 nm.

A gate electrode 30 is formed on the blocking dielectric layer 28. The gate electrode 30 is formed from a conductive material having an appropriate work function for the flash memory unit cell. For example, the gate electrode 30 can be a metal gate made from an elemental metal, or metal alloy, e.g., Mo, Ta, Ti, W, NiTa, and combinations thereof. The gate electrode 30 can also be a metal compound comprising a metal combined with nitrogen or silicon, e.g., HfN, $Mo_2N$, TaN, TiN, WN and WSi. The gate electrode 30 can further be a non-metal conductor having an appropriate work function such as, for example, polycrystalline silicon. In one version, the gate electrode comprises titanium or tantalum in a thickness of from about 20 nm to about 100 nm The semiconductor material 23 of the substrate 22 comprises a source region 32 and a drain region 34, both of which contact the tunneling oxide layer 24. The source and drain regions 32, 34 are doped with ions to provide semiconducting properties in these regions. The ions implanted in the regions 32, 34 depend upon the type of semiconductor material 23. For example, the source and drain regions 32, 34 of a substrate 22 comprising a silicon wafer can have implanted n-type and p-type dopants. Suitable n-type dopant ions when implanted in silicon include, for example, at least one of phosphorous, arsenic and antimony. Suitable p-type dopant ions include, for example, at least one of boron, aluminum, gallium, indium and thallium. For example, the source region 32 can be formed by implanting a p-type dopant, such as boron, into a semiconductor material 23 comprising silicon, and the drain region 34 can be formed by implanting an n-type dopant, such as arsenic or phosphorous, into the semiconductor material 23. The source and drain regions 32, 34 form a p-n junction at the boundary between the two regions. In one example, these ions are implanted into the semiconductor material 23 in a dosage level of from about $1 \times 10^{14}$ atoms/cm$^2$ to about $1 \times 10^{17}$ atoms/cm$^2$.

Returning to the silicon-oxygen-nitrogen layer 26, the layer 26 comprises an oxygen concentration level profile having a predetermined shape which is found to increase the charge retention capability of the layer 26. In one version, the oxygen concentration level profile changes in shape through a thickness of the silicon-oxygen-nitrogen layer 26. For example, the concentration of oxygen can be different between the boundary regions 35a,b of the silicon-oxygen-nitrogen layer 26 and a central portion 36 of the same layer 26, the difference or change in oxygen concentration level being a sufficient amount to increase the charge retention time of the layer 26. For example, the oxygen concentration level profile can be at a higher or lower level at the boundary regions 35a,b of the silicon-oxygen-nitrogen layer 26 which abut or contact other layers, such as the tunneling oxide layer 24 or the blocking dielectric layer 28, relative to the oxygen concentration level profile at a central portion of the layer 26.

Without being limited by an explanation, it has been determined that the electron trap concentration and the distribution of the electron traps in the silicon-oxygen-nitrogen layer 26 depend on the nature of the dangling bonds formed in the silicon-oxygen-nitrogen layer 26. Specifically, it is believed that varying the concentration of silicon and/or nitrogen dangling bonds in the silicon-oxygen-nitrogen layer 26 affects the charge retention properties of the layer 26. Increasing the number of silicon dangling bonds in the silicon-oxygen-nitrogen layer 26 increases the carrier trap concentration. The shallow traps in the energy bandgap created by silicon dangling bonds provide good charge retention speed and increase the data storage speed of the flash memory device. The broad, shallow energy wells require less energy to transfer a charge into the charge trap site. However, the shallow traps created by the silicon dangling bonds are often not sufficiently deep to increase charge retention time. Increasing the number of dangling nitrogen bonds within the silicon-oxygen-nitrogen layer 26 can increase the number of charge trap sites having deeper energy wells because oxygen raises the band edge of the dielectric relative to the trap energy position in SiN. However, a larger number of deeper energy wells can reduce the charge retention speed of the flash memory device.

Thus, the shape of the oxygen concentration profile through the silicon-oxygen-nitrogen layer 26 can control the amount or nature of these different types of dangling bonds in the layer 26. For example, the oxygen concentration level profile in the silicon-oxygen-nitrogen layer 26 can be shaped to provide good charge retention speed in the bulk of the layer 26 while increasing charge retention at the boundaries of the silicon-oxygen-nitrogen layer 26. Thus, a graded oxygen concentration level can be provided through the layer 26 so that the oxygen concentration levels at the boundaries of the layer 26 are different relative to the oxygen concentration level at the inside of the layer 26. For example, deeper energy wells can be created at specific regions of the layer 26 which would reduce the probability of thermal or other de-trapping of the retained charge from these regions. When charge is entrapped in specific sites corresponding to deep energy wells, charge retention is substantially increased as the charge tends to remain isolated within the energy well and does not easily migrate or diffuse out of the trap site with the application of external energy. Thus, increasing the number of deep energy well charge trap sites at the boundary regions 35a,b of the silicon-oxygen-nitrogen layer 26 can reduce charge migration from these boundary regions 35a,b. At the same time, the energy wells formed within the inside of the layer 26 can have shallower energy wells to maintain good charge retention speed.

The ability of the oxygen concentration level profile through the silicon-oxygen-nitrogen layer 26 to control charge retention time of the layer 26 can be demonstrated using potential energy band diagrams. For example, a schematic diagram of the potential band structure of a charge trap film comprising an un-doped silicon nitride layer is shown in FIG. 2A. The gaps 37a,b between the dashed line 38 and the overlying and underlying solid lines 39a,b, respectively, represent the relatively shallow depth of charge traps which allows retained charge to escape from such traps. In contrast, FIG. 2B shows the potential band structure of a charge trap comprising a silicon-oxygen-nitrogen layer 26 having an oxygen concentration level profile 40 which has a maximum of the oxygen concentration level proximate to the blocking dielectric layer 28. The corresponding and adjacent graph shows the upwardly-oriented, gradually increasing curved shape of the relative oxygen concentration level in the silicon-oxygen-nitrogen layer 26 for increasing depth in the layer, with a maxima (local maximum) at the boundary of the blocking dielectric layer 28. The increased trap depth adjacent to the blocking dielectric layer 28 reduces leakage or escape of the charge retained in the layer 26 increasing the overall charge retaining time. The increase in oxygen ions near the blocking layer 28 can be achieved by increasing the ion implantation energy of the oxygen ions implanted into a silicon nitride layer to achieve a silicon-oxygen-nitrogen layer 26 with the curved oxygen concentration level profile. In ion implantation, ionized gaseous species are created in a plasma at low pressure (<0.1 Torr). In a conventional beam-line ion implanter, species are accelerated out of the plasma source and selected in a mass analyzer and then accelerated or decelerated to the desired energy (2 keV to 2 MeV) at the wafer. In plasma ion implantation, a dopant ionized plasma surrounds the wafer, and an electrostatic chuck (ESC) is used to bias and accelerate ions into the wafer (100 eV to 11 keV).

A schematic diagram of the potential band structure of a charge trap film comprising a silicon-oxygen-nitrogen layer 26 having an oxygen ion concentration level gradient which provides an increased trap depth at the center of the charge trap film is shown in FIG. 2C as well as a corresponding graph showing the upward curved shape of the relative oxygen concentration level in the silicon-oxygen-nitrogen layer for increasing depth in the Si-O-N layer. The corresponding graph shows the U-shaped curve of the relative oxygen concentration level in the silicon-oxygen-nitrogen layer 26 as a function of increasing depth in the layer, which peaks at about the middle of the layer and curves downward towards either boundary. For example, the oxygen concentration level profile 40 can have minima proximate to the blocking dielectric layer 28 and tunneling oxide layer 24, and maxima at a middle or central position of the silicon-oxygen-nitrogen layer. In another example, the oxygen concentration level profile 40 can have a first low concentration level or first minima proximate to the blocking dielectric layer 28, a second low concentration level or second minima proximate to the tunneling oxide layer 24, and a higher concentration level or maxima at a middle or central position of the silicon-oxygen-nitrogen layer 26. The increased trap depth adjacent to the blocking dielectric layer 28 reduces leakage or escape of the charge retained in the layer 26, increasing the overall charge-retaining time. The increase in oxygen ions at the central portion of the layer 26 can be achieved by raising the ion implantation energy of the oxygen ions implanted into a silicon nitride layer to achieve a silicon-oxygen-nitrogen layer 26 with the convex-shaped oxygen concentration level profile.

In the versions described above, the charge retention capability of the layer 26 can be increased by at least about 200% by providing an oxygen concentration level that varies through the thickness of the layer 26 from a concentration level minima of about 22% to a concentration level maxima of about 60%. The concentration level maxima of oxygen are maintained at 60% or less because high 0% will decrease Si—N bonds that lead to trap storage sites. In such versions, the silicon-oxygen-nitrogen layer 26 can have relative molar concentration levels of oxygen and nitrogen that vary—for example, the oxygen concentration level can be from about 22 to about 60% and the silicon concentration level can be from about 30 to about 40%. In these versions, the silicon-oxygen-nitrogen layer 26 comprises a thickness of from about 1 to about 10 nm, or even from about 3 to about 8 nm; however, the layer 26 can have other thicknesses as would be apparent to those of ordinary skill in the art.

The shape of the oxygen concentration level profile in the silicon-oxygen-nitrogen layer 26 can be controlled by varying the implantation energy of oxygen ions implanted into a silicon nitride layer. For example, a computer modeled simulation of the oxygen concentration level at increasing depths into a layer 26 as a function of the oxygen ion implantation energy is shown in FIG. 3. This implant simulation model was generated using TRIM. According to the model, oxygen ions implanted at an implantation energy of 200 eV (in a dosage of $1\times10^{16}$ atoms/cm$^2$) provide an oxygen concentration level that varies from about $1\times10^{22}$ atoms/cm$^3$ at the surface of the layer 26 to a concentration level maxima of about $1\times10^{23}$ atoms/cm$^3$ at a depth of about 10 angstroms, and a minimum of $1\times10^{19.5}$ atoms/cm$^3$ at a depth of about 30 angstroms. In contrast, oxygen ions implanted at an implantation energy of 400 eV provide an oxygen concentration level that varies from $1\times10^{22}$ atoms/cm$^3$ at the surface of the layer 26 to a concentration level maxima of about $1\times10^{22.75}$ atoms/cm$^3$ at a depth of about 10 angstroms, and a minimum of $1\times10^{20}$ atoms/cm$^3$ at a depth of about 45 angstroms. This demonstrates that the oxygen concentration level profile in the silicon-oxygen-nitrogen layer 26 can be controlled by changing or adjusting the ion implantation energy during the oxygen ion implantation process.

Exemplary processes for fabricating a flash memory device 20 comprising a silicon-oxygen-nitrogen layer 26 having a shaped oxygen concentration level profile will now be described. In the fabrication process, a surface 42 of the substrate 22 (as shown in FIG. 1) is cleaned using one or more cleaning solutions, including acidic and basic solutions. A suitable acidic solution includes HCl or HF and $H_2O$, and a suitable basic solution includes $H_2O_2$ or $NH_4(OH)$ and $H_2O$. In the cleaning process, an acidic cleaning solution is applied to the surface 42 of the substrate 22 and left on for a time period of from about 2 to about 10 minutes. Thereafter, the substrate 22 can be rinsed off with distilled water and a second cleaning basic solution applied, and so on. The substrate 22 can be dried in an isopropyl alcohol (IPA) drier to remove water marks.

The tunneling oxide layer 24 comprising silicon dioxide can be formed by oxidizing a surface of a substrate 22 comprising a silicon wafer. In this process, the surface 42 is heated while being exposed to an oxidizing environment. For example, the silicon wafer can be exposed to an oxidizing environment comprising oxygen and helium while it is heated to a temperature of from about 700 to about 1100° C. Commercially available gases of $H_2$ and $O_2$ can be used. Typically, the tunneling oxide layer 24 has a thickness of from about 3 nm to about 6 nm.

A silicon-oxygen-nitrogen layer 26 is formed on the tunneling oxide layer 24 to serve as the charge trapping (or charge storing) layer of the flash memory device 20. In one exemplary process, a silicon nitride layer is first deposited using a plasma enhanced chemical vapor deposition (PECVD) process. In this process, a process gas comprising a silicon-containing component and a nitrogen-containing component (or a single component that contains both silicon and nitrogen) is introduced into a process zone 46 holding the substrate 22. The silicon-containing component can be, for example, silane, disilane, trimethylsilyl (TMS), tris(dimethylamino)silane (TDMAS), bis(tertiary-butylamino)silane (BTBAS), dichlorosilane (DCS), and combinations thereof. The nitrogen-containing component can be, for example, ammonia, nitrogen, and combinations thereof. In one version, the process gas comprises $SiH_4$, $NH_3$ and $N_2$. A suitable process gas comprises silane in a flow rate from about 1 to about 200 sccm, and ammonia in a flow rate of from about 10 to about 1000 sccm. The process gas can also include a diluent gas that is provided in a larger volume than the reactive gas components and at least partially as a reactant nitrogen-containing gas. For example, nitrogen can be added in a flow rate of from about 5000 to about 30,000 sccm. The process gas pressure is set at from about 5 Torr to about 500 Torr. A power level of voltage applied to electrodes about the process zone is typically maintained at from about 100 to about 400 watts. The substrate temperature is from about 200 to about 500° C.

In another exemplary process, a silicon nitride layer is deposited using a thermal chemical vapor deposition process using a process gas comprising dichlorosilane, disilane, or silane in a flow rate from about 1 to about 200 sccm, and ammonia in a flow rate of from about 10 to about 1000 sccm. The process gas pressure is set at from about 5 Torr to about 500 Torr. The substrate temperature is from about 650 to about 800° C.

A silicon-oxygen-nitrogen layer 26 can be deposited with the desired oxygen concentration level profile in a single step CVD/implantation process in a CVD chamber. In this process, the process gas may contain oxygen-containing gas in addition to the silicon-containing gas and nitrogen-containing gas, so that oxygen ions are introduced in the layer 26 during the deposition process. The volumetric flow ratio of the individual components of the process gas, chamber pressure, or plasma bias power can be controlled to implant oxygen at different concentration levels within the deposited layer 26. As result, the silicon-oxygen-nitrogen layer 26 is deposited in a single step with the desired oxygen concentration level profile.

An ion implantation process can also be used to implant oxygen ions into the pre-deposited silicon nitride layer to form a silicon-oxygen-nitrogen layer 26 having a shaped oxygen concentration level profile during, or after, deposition of silicon nitride material. In this process, an ion implantation chamber can also be is used to perform the implantation process. Process gas comprising oxygen-containing gas that can form oxygen ions is provided in the process zone 46 and energized to form ions that are implanted into the silicon nitride layer. The oxygen-containing gas can be, for example, oxygen, ozone, or mixtures thereof. The oxygen ions are implanted with an ion implantation energy of less than 600 eV, or even less than 150 eV or even further, less than 50 eV.

In one version, the plasma generated to implant oxygen ions to form a layer 26 can be a non-accelerated (or non-biased) plasma, such as a microwave plasma generated by a radial line slotted antenna (RLSA) in a chamber fabricated by Tokyo Electron, Japan. In the RLSA chamber, microwaves are applied at a frequency of about 2.5 GHz and a power level of from about 1000 to about 3000 watts to a radial line slotted antenna that rests above a quartz plate. Process gas comprising oxygen is introduced into the chamber at a flow rate of 100 sccm to 1 slm and maintained at a pressure of from about 10 mTorr to about 2 Torr. Oxygen ions are implanted into silicon nitride at an ion energy of from about 10 eV to about 20 eV.

In another version, a non-accelerated plasma can be generated in a radio frequency decoupled plasma nitridation or oxidation RF (DPN or DPO) process. In this process, RF power is applied to one or more antenna coils above a ceiling of a chamber at a power level of from about 100 to about 2500 watts to inductively couple energy to the process gas in the process zone 46 of the chamber. Process gas comprising oxygen is introduced into the chamber at a flow rate of 50 sccm to 400 sccm and maintained at a pressure of from about 10 to about 100 mTorr. Oxygen ions are implanted into silicon nitride, at an ion energy of from about 2 eV to about 20 eV.

In still another version, a non-accelerated plasma can be generated in a torroidal plasma reactor, such as a P3i™ chamber from Applied Materials, Santa Clara, Calif. If this chamber, a spinning torroidal field regenerates the plasma of the oxygen-containing gas in the chamber. These oxygen ions are typically implanted with an ion implantation energy of from about 50 eV to about 500 eV.

In yet other versions, an accelerated plasma such as a radio frequency (RF) or direct current (DC) bias can be applied to electrodes about the process zone to generate the plasma. The above described P3i chamber can also be used for this process. These oxygen ions are typically implanted with an ion implantation energy of from about 50 eV to about 1000 eV. The oxygen ion dosage was from about $5 \times 10^{15}$ to $5 \times 10^{16}$ atoms/cm$^2$.

In any of the processes described above, the oxygen ion concentration levels at different depths of the silicon-oxygen-nitrogen layer 26 are controlled by setting different processing parameters during implantation of oxygen ions into a deposited silicon nitride layer to provide a predetermined oxygen concentration level profile 40, as shown in FIGS. 2B and 2C. The adjustments in oxygen ion implantation process conditions are selected to provide a compositional profile of oxygen ions that is shaped to increase the charge retention time of the silicon-oxygen-nitrogen layer 26 relative to the original silicon nitride layer. For example, in a typical oxygen ion profiling process, a plasma is generated from a process gas comprising oxygen-containing gas, as described above. The power level of the plasma can be altered or changed during the implantation process to control the depth to which the oxygen ions are implanted in the silicon nitride layer. For example, the plasma can be switched from (i) a self-biased or non-accelerating plasma which implants ions with an ion energy of less than 50 eV, or even less than 20 eV, to a thickness of up to 2 to 3 nm, to (ii) an RF biased or accelerating plasma which implants ions with an ion energy of 50 to 1000 eV to a deeper thickness of 4 to 6 nm. The different energy plasmas can control the oxygen ion distribution in the layer 26.

In an RF biased plasma, the plasma electrostatic chuck bias energy can be set to a first power level to implant oxygen ions to a first depth in the layer 26. Thereafter, oxygen ions are implanted to a second depth in the layer 26 by changing the energy applied to the plasma to a second power level. In one version, the first power level is a least about 200 eV (electron Volts) higher than the second power level. For example, the first power level can be less than 600 eV, for example, from about 200 to about 600 eV, and the second power level can be from about 400 to about 2000 eV. The source power level is typically set at from about 100 to about 3000 watts.

The oxygen concentration level at different depths in the silicon nitride layer can also be changed by varying the pressure, relative pressure, or composition of the oxygen-containing gas of the process gas. For example, a first pressure of the process gas can be set to obtain a first concentration level of oxygen ions to a first depth in the layer 26. Thereafter, a second pressure of the process gas can be maintained to obtain a second concentration level of oxygen ions to a second depth in the layer 26. For example, the first pressure can be higher than the second pressure by least about 0.1 Torr. In one version, the first pressure is less than about 20 Torr, and the second pressure is at least about 1 Torr.

For example, a silicon-oxygen-nitrogen layer 26 having an oxygen concentration level profile 40 which has a maxima oxygen concentration level proximate to the blocking dielectric layer 28 can be obtained by using a low energy <200 eV implantation energy with a plasma, biased plasma, or ion implanter.

As another example, an oxygen concentration level profile 40, comprising a first minima concentration level proximate to the blocking dielectric layer 28, a second minima concentration level proximate to the tunneling oxide layer 24, and a concentration level maxima at a central position of the silicon-oxygen-nitrogen layer 26, can be obtained by using an oxygen ion energy between >200 eV and <1 keV, optimally 500 eV for a 6 nm SiN film.

During or after the ion implantation process, the silicon-oxygen-nitrogen layer 26 on the substrate 22 is annealed by heating the substrate 22 to a temperature of at least about 50° C., or even from about 300° C. to about 550° C. The annealing process activates the implanted oxygen ions.

The blocking dielectric layer 28 is then deposited on the silicon-oxygen-nitrogen layer 26 by chemical vapor deposition (CVD) or atomic layer deposition (ALD) methods. For example, a blocking dielectric layer 28 comprising aluminum oxide can be deposited by CVD using a process gas comprising an aluminum-containing gas and an oxygen-containing gas. The process gas is reacted by a plasma or thermal energy to deposit an aluminum oxide layer on the substrate 22. Suitable aluminum-containing gases include Trieethyl(tri-sec-butoxy)dialuminum, TMA Trimethyl Aluminum, or TDEAA, Tetrakis[DiEthylAmino] Aluminum Al[N(C2H5)2]4, and suitable oxygen-containing gases include $O_2$ or $N_2O$.

The gate electrode 30 is formed on the blocking dielectric layer 28, e.g., by conventional physical vapor deposition (PVD), CVD, or atomic layer deposition (ALD) methods. Suitable PVD methods can be used to deposit gate elemental metal or metal alloys such as, for example, Mo, Ta, Ti, W, NiTa and alloys thereof. Suitable CVD methods can be used to deposit metal compounds such as HfN, $Mo_2N$, TaN, TiN, WN and WSi. In one version, the gate electrode 30 comprises titanium or tantalum, deposited to a thickness of from about 20 nm to about 100 nm.

During or after deposition, the gate electrode 30, blocking dielectric layer 28, silicon-oxygen-nitrogen layer 26, and tunneling oxide layer 24 are patterned to form the vertically stacked structure 44 shown in FIG. 1. Typically, the shape of the stacked structure 44 is formed by photo or electron lithography methods, followed by conventional etching processes. While the stacked structure 44 is shown in a simplified form, the stacked structure 44 can also have other shapes or designs as would be apparent to those of ordinary skill in the art.

After the stacked structure 44 is formed, dopant(s) can be implanted into the surface of the substrate 22 exposed on both sides of the stacked structure 44 to form the doped regions 32, 34. The dopant ions can include, for example, arsenic, boron or phosphorous. Conventional implantation methods can be used to form the doped regions 32, 34. The doped regions 32, 34 are then annealed to form the source region 32 and drain region 34, completing the unit cell of the flash memory device 20.

An embodiment of a substrate processing chamber 45, which can be used to deposit the tunneling oxide layer 24, silicon nitride layer 26, and blocking dielectric layer 28, is illustrated in FIG. 4. The chamber 45 is a PECVD Producer-type chamber available from Applied Materials, Santa Clara, Calif., and is provided only to illustrate some exemplary CVD processes; however, other chambers may also be used, as would be apparent to one of ordinary skill in the art. The chamber 45 is a plasma enhanced chemical vapor deposition (PECVD) chamber suitable for processing a substrate 22 such as a silicon wafer. The chamber 45 comprises enclosure walls 50—which include a ceiling 52, sidewalls 54, and a bottom wall 56—that enclose a process zone 46. For processing a 300 mm silicon wafer, the chamber 45 typically has a volume of about 20,000 to about 30,000 $cm^3$, and more typically about 24,000 $cm^3$. The chamber 45 may also comprise a liner (not shown) that lines at least a portion of the enclosure walls 50 about the process zone 46. At least a portion of the walls 50, such as the ceiling 52, can also form a process electrode 48a.

During a process cycle, the substrate support 58 is lowered and a substrate 22 is passed through an inlet port 62 and placed on the support 58 by a substrate transport 64, such as a robot arm. The substrate support 58 can be moved between a lower position for loading and unloading and an adjustable upper position for processing of the substrate 22. The substrate support 58 can include an enclosed electrode 48b that operates in conjunction with the electrode 48a to generate a plasma from process gas introduced into the chamber 45. The substrate support 58 can be heated by a heater 68, which can be an electrically resistive heating element (as shown), a heating lamp (not shown), or the plasma itself. The substrate support 58 typically comprises a ceramic structure which has a receiving surface to receive the substrate 22, and which protects the electrode 48b and heater 68 from the chamber 45 environment. In use, a direct current (DC) voltage is applied to the heater 68 to heat the substrate 22, and a separate voltage is applied to the electrode 48b in the substrate support 58 to electrostatically clamp the substrate 22 to the support 58.

After a substrate 22 is loaded onto the support 58, the support 58 is raised to a processing position that is closer to the gas distributor 72 to provide a desired spacing gap therebetween. The spacing gap distance can be from about 2 mm to about 12 mm. The gas distributor 72 is located above the process zone 46 for dispersing a process gas uniformly across the substrate 22. The gas distributor 72 can separately deliver two independent streams of first and second process gas to the process zone 46 without mixing the gas streams prior to their introduction into the process zone 46 or can premix the process gas before providing the premixed process gas to the process zone 46. The gas distributor 72 comprises a faceplate 74 having holes 76 that allow the passage of process gas therethrough. The faceplate 74 is typically made of metal to allow the application of a voltage or potential thereto, and thereby serves as electrode 48a in the chamber 45. A suitable faceplate 74 can be made of aluminum with an anodized coating.

The substrate processing chamber 45 also comprises first and second gas sources 80a,b to deliver the first and second process gas to the gas distributor 72. In one version, the first gas source 80a comprises a first gas conduit 84a and a first gas valve 86a to deliver a first process gas from the first gas source 80a to a first inlet 78a of the gas distributor 72, and the second gas source 80b comprises a second gas conduit 84b and a second gas valve 86b to deliver a second process gas from the second gas source 80b to a second inlet 78b of the gas distributor 72.

The process gas can be energized by coupling electromagnetic energy, e.g., high frequency voltage energy to the process gas to form a plasma from the process gas. To energize the first process gas, a voltage is applied between (i) the first electrode 48a, which may be the gas distributor 72, ceiling 52 or chamber sidewall 54, and (ii) the second electrode 48b in the support 58. The voltage applied across the pair of electrodes 48a,b capacitively couples energy to the process gas in the process zone 46. Typically, the voltage applied to the electrodes 48a,b is an alternating voltage which oscillates at a radio frequency. Generally, radio frequencies cover the range of from about 3 kHz to about 300 GHz. For the purposes of the present application, low radio frequencies are those which are less than about 1 MHz, and more preferably from about 100 KHz to 1 MHz, (e.g., a frequency of about 300 KHz). Also for the purposes of the present application, high radio frequencies are those from about 3 MHz to about 60 MHz, or even about 13.56 MHz. The selected radio frequency voltage is applied to the first electrode 48a at a power level of from about 10 to about 1000 watts, and the second electrode 48b is typically grounded. The particular radio frequency range that is used and the power level of the applied voltage depend on the type of material to be deposited.

The chamber 45 also comprises a gas exhaust 90 to remove spent process gas and byproducts from the chamber 45 and maintain a predetermined pressure of process gas in the process zone 46. In one version, the gas exhaust 90 includes a pumping channel 92 that receives spent process gas from the process zone 46, an exhaust port 94, a throttle valve 96, and one or more exhaust pumps 98 to control the pressure of process gas in the chamber 45. The exhaust pumps 98 may include one or more of a turbo-molecular pump, cryogenic pump, roughing pump, and combination-function pumps that have more than one function. The chamber 45 may also comprise an inlet port or tube (not shown) through the bottom wall 56 of the chamber 45 to deliver a purging gas into the chamber 45.

A controller 102 is also provided to control the operation and operating parameters of the chamber 45. The controller 102 may comprise, for example, a conventional processor and memory. The processor executes chamber control software, such as a computer program stored in the memory. The memory may be a hard disk drive, read-only memory, flash memory, or other types of memory. The controller 102 may also comprise other components, such as a floppy disk drive and a card rack. The card rack may contain a single-board computer, analog and digital input/output boards, interface boards, and stepper motor controller boards. The chamber control software includes sets of instructions that dictate the timing, mixture of gases, chamber pressure, chamber temperature, microwave power levels, high frequency power levels, support position, and other parameters of a particular process.

The chamber 45 also comprises a power supply 104 to deliver power to various chamber components such as, for example, an electrode 48b in the substrate support 58 and an electrode 48a in the chamber 45. To deliver power to the chamber electrodes 48a,b the power supply 104 comprises a radio frequency voltage source that provides a voltage having the selected radio frequencies and the desired selectable power levels. The power supply 104 can include a single radio frequency voltage source or multiple voltage sources that provide both high and low radio frequencies. The power supply 104 can also include an RF matching circuit. The power supply 104 can further comprise an electrostatic charging source to provide an electrostatic charge to an electrode of an electrostatic chuck in the substrate support 58. When a heater 68 is used within the substrate support 58, the power supply 104 also includes a heater power source that provides an appropriate controllable voltage to the heater 68. When a DC bias is to be applied to the gas distributor 72 or the substrate support 58, the power supply 104 also includes a DC bias voltage source that is connected to a conducting metal portion of the faceplate 74 of the gas distributor 72. The power supply 104 can also include the source of power for other chamber components, e.g., motors and robots of the chamber.

The substrate processing chamber 45 also comprises a temperature sensor (not shown) such as a thermocouple or an interferometer to detect the temperature of surfaces, such as component surfaces or substrate surfaces, within the chamber 45. The temperature sensor is capable of relaying its data to the chamber controller 102 which can then use the temperature data to control the temperature of the processing chamber 45, e.g., by controlling the heater 68 in the substrate support 58.

A flash memory device comprising a silicon-oxygen-nitrogen layer 26, having a shaped oxygen concentration level profile 40 as deposited by the exemplary processes provided herein, has a higher charge retention time without sacrificing the charging speed.

Although exemplary embodiments of the present invention are shown and described, those of ordinary skill in the art may devise other embodiments which incorporate the present invention and which are also within the scope of the present invention. Furthermore, the terms below, above, bottom, top, up, down, first and second and other relative or positional terms are shown with respect to the exemplary embodiments in the figures and are interchangeable. Therefore, the appended claims should not be limited to the descriptions of the preferred versions, materials, or spatial arrangements described herein to illustrate the invention.

What is claimed is:

1. A flash memory device comprising:
   (a) a substrate comprising a semiconductor material;
   (b) a tunneling oxide layer on the semiconductor material;
   (c) a silicon-oxygen-nitrogen layer directly on the tunneling oxide layer, the silicon-oxygen-nitrogen layer comprising an oxygen concentration level profile through the thickness of the silicon-oxygen-nitrogen layer, the oxygen concentration level profile having a minima proximate to the tunneling oxide layer;
   (d) a blocking dielectric layer directly on the silicon-oxygen-nitrogen layer; and
   (e) a gate electrode directly on the blocking dielectric layer.

2. A device according to claim 1 wherein the oxygen concentration level profile comprises an oxygen concentration level that varies through the thickness of the silicon-oxygen-nitrogen layer.

3. A device according to claim 1 wherein the oxygen concentration level profile comprises a concentration level maxima proximate to the blocking dielectric layer.

4. A device according to claim 1 wherein the oxygen concentration level profile comprises a concentration level minima proximate to the blocking dielectric layer.

5. A device according to claim 4 wherein the oxygen concentration level profile further comprises a concentration level maxima at a central portion of the silicon-oxygen-nitrogen layer.

6. A device according to claim 1 wherein the oxygen concentration level profile varies from about 22% to about 60% relative molar concentration.

7. A device according to claim 1 wherein the silicon-oxygen-nitrogen layer comprises a relative molar concentration of oxygen that varies from about 22 to about 60% and a relative molar concentration of silicon that varies from about 30 to about 40%.

8. A device according to claim 1 wherein the silicon-oxygen-nitrogen layer comprises a thickness of from about 1 to about 10 nm.

9. A device according to claim 1 comprising at least one of the following:
(i) the tunneling oxide layer comprises a silicon dioxide layer having a thickness of from about 1 to about 10 nm;
(ii) the blocking dielectric layer comprises an aluminum oxide layer having a thickness of from about 10 nm to about 250 nm; and
(iii) the gate electrode comprises titanium or tantalum.

10. A method of forming a flash memory device, the method comprising:
(a) providing a substrate comprising a semiconductor material;
(b) forming a tunneling oxide layer on the semiconductor material;
(c) forming directly on the tunneling oxide layer, a silicon-oxygen-nitrogen layer comprising an oxygen concentration level profile through the thickness of the silicon-oxygen-nitrogen layer, the oxygen concentration level profile having a minima proximate to the tunneling oxide layer;
(d) depositing a blocking dielectric layer directly on the silicon-oxygen-nitrogen layer; and
(e) depositing a gate electrode directly on the blocking dielectric layer.

11. A method according to claim 10 comprising forming the oxygen concentration level profile to have a concentration level maxima proximate to the blocking dielectric layer.

12. A method according to claim 10 comprising forming the oxygen concentration level profile to have a concentration level minima proximate to the blocking dielectric layer.

13. A method according to claim 12 comprising forming the oxygen concentration level profile to have a concentration level maxima at a central portion of the silicon-oxygen-nitrogen layer.

14. A method according to claim 10 comprising forming the oxygen concentration level profile to have a relative molar concentration of oxygen that varies from about 22 to about 60%.

15. A method according to claim 14 comprising forming the silicon-oxygen-nitrogen layer to have a silicon concentration level profile in which the relative molar concentration of silicon varies from about 30 to about 40%.

16. A method according to claim 10 wherein (c) comprises:
forming a silicon nitride layer on the tunneling oxide layer; and
(ii) forming the oxygen concentration level profile through the thickness of the silicon nitride layer by varying an ion implantation energy of oxygen ions being implanted into the silicon nitride layer.

17. A method according to claim 16 comprising implanting oxygen ions in a silicon nitride layer having a thickness of from about 1 to about 10 nm.

18. A method according to claim 17 comprising implanting the oxygen ions with an ion energy level of less than 600 eV.

19. A method according to claim 18 comprising implanting the oxygen ions with an ion energy level of less than 150 eV.

20. A method according to claim 19 comprising implanting the oxygen ions with a self-biasing or RF biased plasma.

21. A method according to claim 16 comprising forming a silicon nitride layer by:
(1) placing the substrate in a process zone;
(2) introducing a process gas into the processing zone, the process gas comprising silicon-containing gas and nitrogen-containing gas;
(3) maintaining a pressure of the process gas of from about 5 to about 500 Torr; and
(4) heating the substrate to a temperature of 600 to 800° C.

22. A method according to claim 21 wherein the process gas comprises $SiH_4$, $NH_3$ and $N_2$.

23. A method according to claim 10 comprising forming the oxygen concentration level profile by varying at least one of the pressure, relative pressure, and composition of an oxygen-containing process gas.

24. A method according to claim 23 comprising forming a first concentration level of oxygen ions at a first depth in the silicon-oxygen-nitrogen layer by maintaining the oxygen-containing process gas at a first pressure and forming a second concentration level of oxygen ions at a second depth in the silicon-oxygen-nitrogen layer by maintaining the oxygen-containing process gas at a second pressure.

25. A method according to claim 24 wherein the second pressure is higher than the first pressure by at least about 0.1 Torr.

26. A flash memory device comprising:
(a) a substrate comprising a semiconductor material;
(b) a tunneling oxide layer on the semiconductor material;
(c) a silicon-oxygen-nitrogen layer directly on the tunneling oxide layer, the silicon-oxygen-nitrogen layer comprising an oxygen concentration level profile through the thickness of the silicon-oxygen-nitrogen layer, the oxygen concentration level profile having a maxima at a central portion of the silicon-oxygen-nitrogen layer;
(d) a blocking dielectric layer directly on the silicon-oxygen-nitrogen layer; and
(e) a gate electrode directly on the blocking dielectric layer.

27. A device according to claim 26 comprising at least one of the following:
(i) the tunneling oxide layer comprises a silicon dioxide layer having a thickness of from about 1 to about 10 nm;
(ii) the blocking dielectric layer comprises an aluminum oxide layer having a thickness of from about 10 nm to about 250 nm;
(iii) the gate electrode comprises titanium or tantalum;
(iv) the oxygen concentration level profile comprises an oxygen concentration level that varies from about 22 to about 60% molar concentration; and
(v) the silicon-oxygen-nitrogen layer comprises a relative molar concentration of silicon that varies from about 30 to about 40%.

28. A device according to claim 26 wherein the oxygen concentration level profile comprises a concentration level minima proximate to the tunneling oxide layer.

29. A device according to claim 26 wherein the oxygen concentration level profile comprises a concentration level minima proximate to the blocking dielectric layer.

30. A device according to claim 26 wherein the silicon-oxygen-nitrogen layer comprises a thickness of from about 1 to about 10 nm.

* * * * *